(12) United States Patent
Sugiyama

(10) Patent No.: US 12,057,835 B2
(45) Date of Patent: Aug. 6, 2024

(54) PROGRAMMABLE LOGIC CIRCUIT DEVICE AND IMAGE PROCESSING APPARATUS

(71) Applicant: FUJIFILM Business Innovation Corp., Tokyo (JP)

(72) Inventor: Fumiaki Sugiyama, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 495 days.

(21) Appl. No.: 17/315,387

(22) Filed: May 10, 2021

(65) Prior Publication Data

US 2022/0182061 A1 Jun. 9, 2022

(30) Foreign Application Priority Data

Dec. 8, 2020 (JP) ................................ 2020-203674

(51) Int. Cl.
*H03K 19/177* (2020.01)
*H03K 19/173* (2006.01)
*H03K 19/17748* (2020.01)

(52) U.S. Cl.
CPC ... *H03K 19/17748* (2013.01); *H03K 19/1733* (2013.01)

(58) Field of Classification Search
CPC ..................... H03K 19/1733; H03K 19/17748
See application file for complete search history.

(56) References Cited

U.S. PATENT DOCUMENTS

| | | | | |
|---|---|---|---|---|
| 6,973,608 B1* | 12/2005 | Abramovici | .......... | G06F 11/142 714/E11.134 |
| 7,216,277 B1* | 5/2007 | Ngai | .................. | G11C 29/4401 714/733 |
| 7,619,438 B1* | 11/2009 | Trimberger | ...... | H03K 19/17764 365/189.12 |
| 8,117,580 B1* | 2/2012 | Trimberger | ............. | G06F 30/34 716/136 |
| 8,975,917 B2 | 3/2015 | Yoneda | | |
| 2006/0091899 A1* | 5/2006 | Akimichi | ......... | H03K 19/17764 326/10 |
| 2014/0043349 A1* | 2/2014 | Parmar | ................ | G09G 3/3473 345/547 |
| 2020/0114905 A1* | 4/2020 | Ueta | ................ | H03K 19/17744 |

FOREIGN PATENT DOCUMENTS

| | | |
|---|---|---|
| JP | 2011-199639 | 10/2011 |
| JP | 2012-114846 | 6/2012 |
| JP | 2013-211845 | 10/2013 |
| JP | 6049969 | 12/2016 |

* cited by examiner

*Primary Examiner* — Kurtis R Bahr
(74) *Attorney, Agent, or Firm* — JCIPRNET

(57) ABSTRACT

A programmable logic circuit device includes: a processor; and plural reconfiguration regions each including a circuit configured by change of connection between elements. The processor is configured to: upon detection of an abnormality while performing processing in a state in which the elements in the reconfiguration regions are connected in accordance with reconfiguration data designating connection between the elements in the reconfiguration regions, acquire reconfiguration data designating such connection between the elements that the processing being performed is not performed; and change connection between the elements in the reconfiguration regions in accordance with the designation by the acquired reconfiguration data.

12 Claims, 8 Drawing Sheets

FIG. 3

| SEQUENCE PROCESSING ID | RECONFIGURATION DATA ID | | |
|---|---|---|---|
| | READING | IMAGE PROCESSING | WRITING |
| S01 | R01 | G01 | W01 |
| S02 | R02 | G02 | W02 |
| S03 | R03 | G01 | W03 |
| S04 | R03 | G02 | W01 |
| S05 | R01 | G03 | W01 |
| S06 | R01 | G02 | W01 |
| S07 | R02 | G04 | W02 |
| S08 (FOR ABNORMAL STATE) | R03 | G05 | W03 |

PROGRAMMABLE LOGIC CIRCUIT DEVICE AND IMAGE PROCESSING APPARATUS

CROSS-REFERENCE TO RELATED APPLICATIONS

This application is based on and claims priority under 35 USC 119 from Japanese Patent Application No. 2020-203674 filed Dec. 8, 2020.

BACKGROUND (i) Technical Field

The present disclosure relates to a programmable logic circuit device and an image processing apparatus.

(ii) Related Art

In recent years, programmable logic circuit devices such as field programmable gate arrays (FPGAs) and programmable logic devices (PLDs) are used as trial devices or replacement devices in manufacture of application specific integrated circuits (ASICs) in fields such as a digital circuit device. A programmable logic circuit device can realize a logic function desired by a user by changing connection between elements and rewriting a circuit (hereinafter referred to as reconfiguration). Furthermore, reconfiguration of a circuit in a programmable logic circuit device makes it possible to, for example, easily deal with a specification change and correct a circuit defect.

For example, Japanese Unexamined Patent Application Publication No. 2011-199639 describes plural reconfiguration regions each including a circuit reconfigured by change of connection between elements and shifting to an energy saving mode by selectively reconfiguring these reconfiguration regions based on states of processing performed by the reconfiguration regions.

SUMMARY

Aspects of non-limiting embodiments of the present disclosure relate to addressing an abnormality without initializing whole reconfiguration regions each including a circuit reconfigured by change of connection between elements.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a programmable logic circuit device including: a processor; and plural reconfiguration regions each including a circuit configured by change of connection between elements. The processor is configured to: upon detection of an abnormality while performing processing in a state in which the elements in the reconfiguration regions are connected in accordance with reconfiguration data designating connection between the elements in the reconfiguration regions, acquire reconfiguration data designating such connection between the elements that the processing being performed is not performed; and change connection between the elements in the reconfiguration regions in accordance with the designation by the acquired reconfiguration data.

BRIEF DESCRIPTION OF THE DRAWINGS

An exemplary embodiment of the present disclosure will be described in detail based on the following figures, wherein:

FIG. 3 illustrates an example of reconfiguration data according to the present exemplary embodiment;

DETAILED DESCRIPTION

Figure 1:
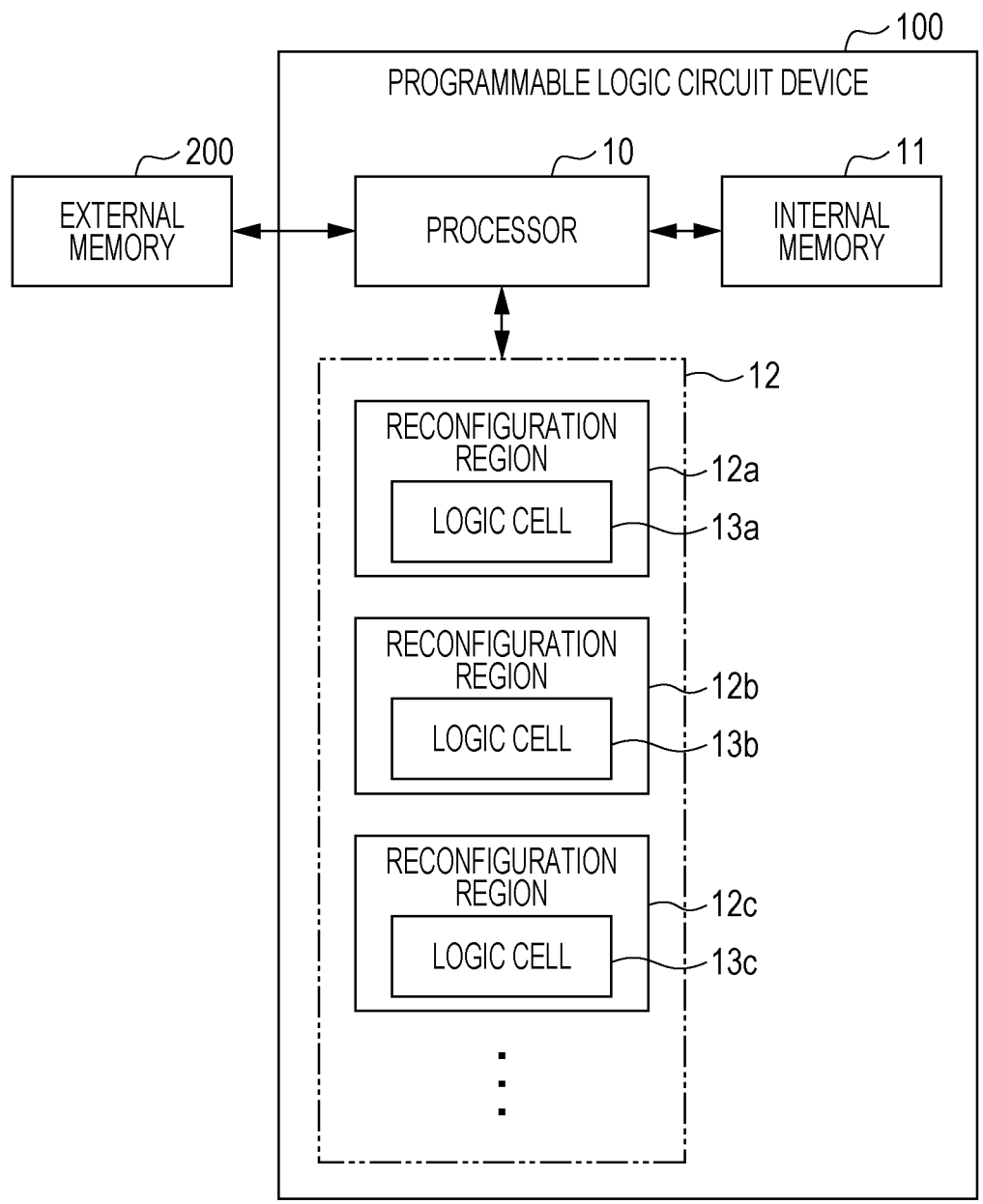
FIG. 1 is a block diagram illustrating an example of a configuration of a programmable logic circuit device according to an exemplary embodiment of the present disclosure.

A configuration of a programmable logic circuit device 100 according to an exemplary embodiment of the present disclosure is described with reference to FIG. 1. The programmable logic circuit device 100 is, for example, a field programmable gate array (FPGA) or a programmable logic device (PLD) and has a processor 10, an internal memory 11, and plural reconfiguration regions 12a, 12b, 12c . . . (hereinafter collectively referred to as reconfiguration regions 12). The processor 10 may include plural processors. The internal memory 11 is, for example, a rewritable memory element such as an electrically erasable and programmable read only memory (EEPROM) or a static random access memory (SRAM). Each of the reconfiguration regions 12 includes corresponding one of logic cells 13a, 13b, 13c . . . (hereinafter collectively referred to as logic cells 13), which are circuits configured by change of connection between elements, and a lookup table (not illustrated) in which reconfiguration data designating connection between elements in the logic cell is written. Hereinafter, rewriting the logic cell 13 by changing connection between elements is referred to as reconfiguration. An external memory 200 is, for example, a rewritable memory element such as an EEPROM or a SRAM.

The processor 10 receives an instruction to perform sequence processing, for example, from an external central processing unit (CPU). The sequence processing is a processing group including a series of plural kinds of processing performed in a preset order and is an example of "processing" according to the present disclosure. For example, in a case where the programmable logic circuit device 100 is mounted in an image processing apparatus such as a printer, the sequence processing is made up of three kinds of processing: processing for reading data from an outside of the programmable logic circuit device 100, image processing on the read data, and processing for writing the data that has been subjected to the image processing to the outside of the programmable logic circuit device 100. As for the processing for reading data from the outside of the programmable logic circuit device 100 among these kinds of processing, there are plural kinds of reading processing that are different in order of data reading (for example, whether data is read out in a second scanning direction or read out in a first scanning direction). That is, these kinds of reading processing are different in connection between elements in a reconfiguration region 12 for performing the reading processing, and different reconfiguration data are needed for the respective kinds of reading processing accordingly. As for the image processing performed on the read data, there are plural kinds of image processing that are different in processing itself on the data (for example, color conversion processing or filter processing). These kinds of image processing are different in connection between elements in a reconfiguration region 12 for performing the image processing, and different reconfiguration data are needed for the respective kinds of image processing accordingly. As for the processing for writing the data that has been subjected to the image processing, there are plural kinds of writing processing that are different in image rotation or enlargement/reduction or data writing order (for example, whether data is written in a second scanning direction or written in a first scanning direction). Accordingly, these kinds of writing processing are different in connection between elements in a reconfiguration region 12 for performing the writing processing, and different reconfiguration data are needed for these kinds of writing processing accordingly.

Figure 2:
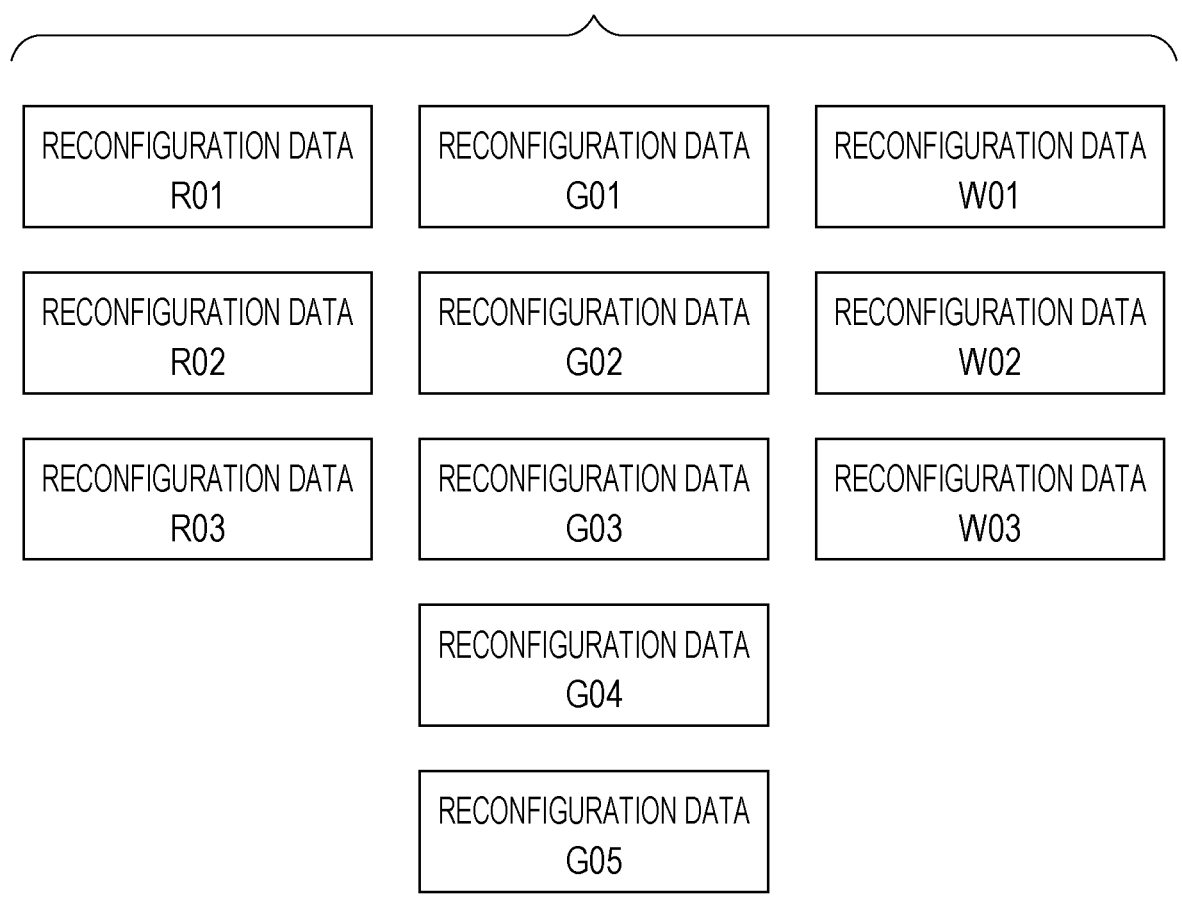
FIG. 2 illustrates an example of management data according to the present exemplary embodiment.

FIG. 2 illustrates an example of reconfiguration data. In the example of FIG. 2, reconfiguration data R01 and reconfiguration data R02 are prepared as reconfiguration data for performing processing for reading data from the outside of the programmable logic circuit device 100. Furthermore, reconfiguration data R03 for an abnormal state is prepared as reconfiguration data concerning processing for reading data from the outside during occurrence of an abnormality. Examples of the abnormality include malfunction of a fan of an image processing apparatus, an abnormality concerning heat, no response from a CPU, and processing time-out. Connections between elements in a logic cell designated by these reconfiguration data are different.

Furthermore, reconfiguration data G01, reconfiguration data G02, reconfiguration data G03, and reconfiguration data G04 are prepared as reconfiguration data for performing image processing on the read data. Furthermore, reconfiguration data G05 for an abnormal state is prepared as reconfiguration data concerning image processing during occurrence of an abnormality. Connections between elements in a logic cell designated by these reconfiguration data are different.

Furthermore, reconfiguration data W01 and reconfiguration data W02 are prepared as reconfiguration data for performing the processing for writing the data that has been subjected to the image processing to the outside of the programmable logic circuit device 100. Furthermore, reconfiguration data W03 for an abnormal state is prepared as reconfiguration data concerning processing for writing data to the outside during occurrence of an abnormality. Connections between elements in a logic cell designated by these reconfiguration data are different.

The reconfiguration data illustrated in FIG. 2 are stored in the external memory 200. Accordingly, a storage capacity of the internal memory 11, that is, a circuit scale of the programmable logic circuit device 100 is smaller than that in a case where the reconfiguration data are stored in the internal memory 11.

In the internal memory 11, management data for designating plural reconfiguration data for performing the plural kinds of processing that constitute the sequence processing is stored. FIG. 3 illustrates an example of the management data. In the example of FIG. 3, each of sequence processing IDs "S01" to "S08" is associated with reconfiguration data IDs of plural reconfiguration data designating connection between elements in the logic cell 13 the sequence processing is performed. For example, reconfiguration data given reconfiguration data IDs "R01", "G01", and "W01" are designated as reconfiguration data for performing sequence processing given a sequence processing ID "S01". The reconfiguration data given the reconfiguration data ID "R01" is reconfiguration data for performing processing for reading data from an outside in the sequence processing given the sequence processing ID "S01". The reconfiguration data given the reconfiguration data ID "G01" is reconfiguration data for performing image processing on the read data in the sequence processing given the sequence processing ID "S01". The reconfiguration data given the reconfiguration data ID "W01" is reconfiguration data for performing processing for writing the data that has been subjected to the image processing in the sequence processing given the sequence processing ID "S01". Such management data does not include reconfiguration data themselves (i.e., information on connection between elements) and includes only reconfiguration data IDs, which are identification information of the reconfiguration data. Accordingly, a total data size is smaller than that in a case where the reconfiguration data themselves are included.

During occurrence of an abnormality described above, sequence processing given the sequence processing ID "S8" is performed. In this sequence processing given the sequence processing ID "S08", the reconfiguration data given reconfiguration data IDs "R03", "G05", and "W03" are designated as reconfiguration data for an abnormal state. These reconfiguration data for an abnormal state are reconfiguration data for designating connection between elements so that sequence processing that is being performed at a time of occurrence of an abnormality is not performed. Specifically, the reconfiguration data given the reconfiguration data ID "R03" is reconfiguration data for discarding data read from the outside in the sequence processing that is being performed at the time of occurrence of the abnormality. The reconfiguration data given the reconfiguration data ID "G05" is reconfiguration data for discarding data obtained by performing image processing on the data read in the sequence processing that is being performed at the time of occurrence of the abnormality. The reconfiguration data given the reconfiguration data ID "W03" is reconfiguration data for writing predetermined data into a memory into which the data obtained by performing image processing on the data read in the sequence processing that is being performed at the time of occurrence of the abnormality is written. The predetermined data is, for example, meaningless data such as "0".

Figure 4:
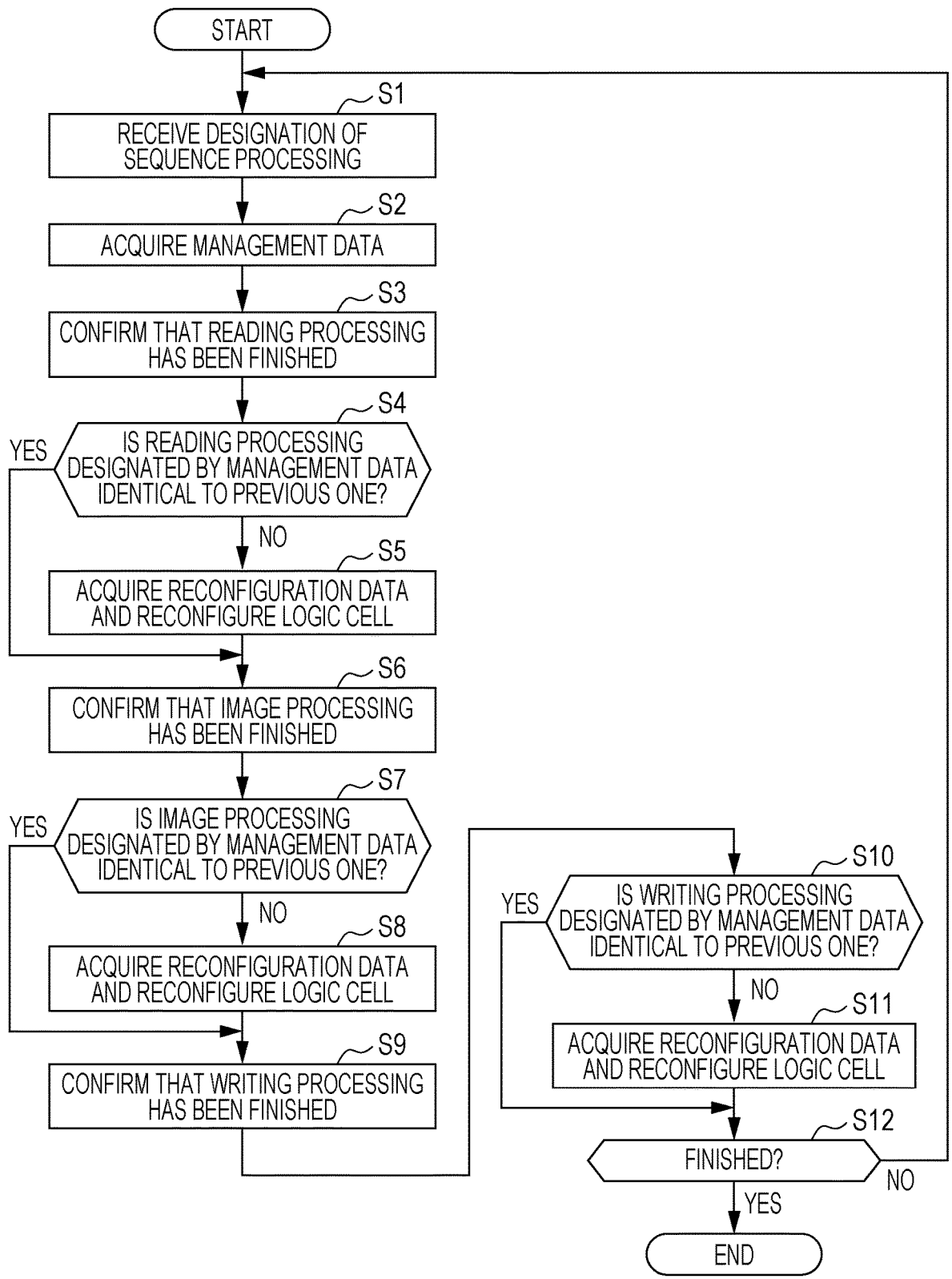
FIG. 4 is a flowchart illustrating operation concerning reconfiguration according to the present exemplary embodiment.

Next, an example of normal operation of the programmable logic circuit device 100, that is, operation performed when no abnormality is occurring is described with reference to FIG. 4. In FIG. 4, an external CPU or the like instructs the processor 10 to perform certain sequence processing by designating a sequence processing ID. The processor 10 receives the designation of the sequence processing ID (step S1) and acquires management data corresponding to the sequence processing ID from the internal memory 11 (step S2).

Next, after confirming that data reading processing corresponding to previous sequence processing has been finished (step S3), the processor 10 determines whether or not a reconfiguration data ID of reading processing designated by the acquired management data and a reconfiguration data ID of the data reading processing corresponding to the previous sequence processing are identical (step S4). In a case where the reconfiguration data ID of the reading processing designated by the management data and the reconfiguration data ID of the data reading processing corresponding to the previous sequence processing are not identical (No in step S4), the processor 10 acquires reconfiguration data corresponding to the reconfiguration data ID of the reading processing designated by the management data from the external memory 200 by using this reconfiguration data ID as a key since reconfiguration of a reconfiguration region is necessary. Then, the processor 10 performs reconfiguration in the logic cell 13 of the reconfiguration region 12 based on the acquired reconfiguration data (step S5). Specifically, the processor 10 writes the reconfiguration data into a look-up table in any of the reconfiguration regions. This changes connection between elements in the logic cell in the reconfiguration region with reference to the look-up table. The reconfigured logic cell 13 starts processing for reading data from the outside. In a case where the reconfiguration data ID of the reading processing designated by the management data and the reconfiguration data ID of the reading processing corresponding to the previous sequence processing are identical (Yes in step S4), the processor 10 skips the process in step S5 since reconfiguration of a reconfiguration region is unnecessary.

Next, after confirming that image processing corresponding to the previous sequence processing has been finished (step S6), the processor 10 determines whether or not a reconfiguration data ID of image processing designated by the acquired management data and a reconfiguration data ID of the image processing corresponding to the previous sequence processing are identical (step S7). In a case where the reconfiguration data ID of the image processing designated by the management data and the reconfiguration data ID of the image processing corresponding to the previous sequence processing are not identical (No in step S7), the processor 10 acquires reconfiguration data corresponding to the reconfiguration data ID of the image processing designated by the management data from the external memory 200 by using this reconfiguration data ID as a key. Then, the processor 10 performs reconfiguration in the logic cell 13 of the reconfiguration region 12 based on the acquired reconfiguration data (step S8). The reconfigured logic cell 13 starts image processing on the read data. In a case where the reconfiguration data ID of the image processing designated by the management data and the reconfiguration data ID of the image processing corresponding to the previous sequence processing are identical (Yes in step S7), the processor 10 skips the process in step S8.

Next, after confirming that data writing processing corresponding to the previous sequence processing has been finished (step S9), the processor 10 determines whether or not a reconfiguration data ID of writing processing designated by the acquired management data and a reconfiguration data ID of the data writing processing corresponding to the previous sequence processing are identical (step S10). In a case where the reconfiguration data ID of the writing processing designated by the management data and the reconfiguration data ID of the writing processing corresponding to the previous sequence processing are not identical (No in step S10), the processor 10 acquires reconfiguration data corresponding to the reconfiguration data ID of the writing processing designated by the management data from the external memory 200 by using this reconfiguration data ID as a key. Then, the processor 10 performs reconfiguration in the logic cell 13 of the reconfiguration region 12 based on the acquired reconfiguration data (step S11). The reconfigured logic cell 13 starts processing for writing the data that has been subjected to the image processing after the image processing. In a case where the reconfiguration data ID of the writing processing designated by the management data and the reconfiguration data ID of the writing processing corresponding to the previous sequence processing are identical (Yes in step S10), the processor 10 skips the process in step S11.

When the final writing processing that constitutes the sequence processing is finished (Yes in step S12), the processor 10 finishes the processing illustrated in FIG. 4.

Figure 5:
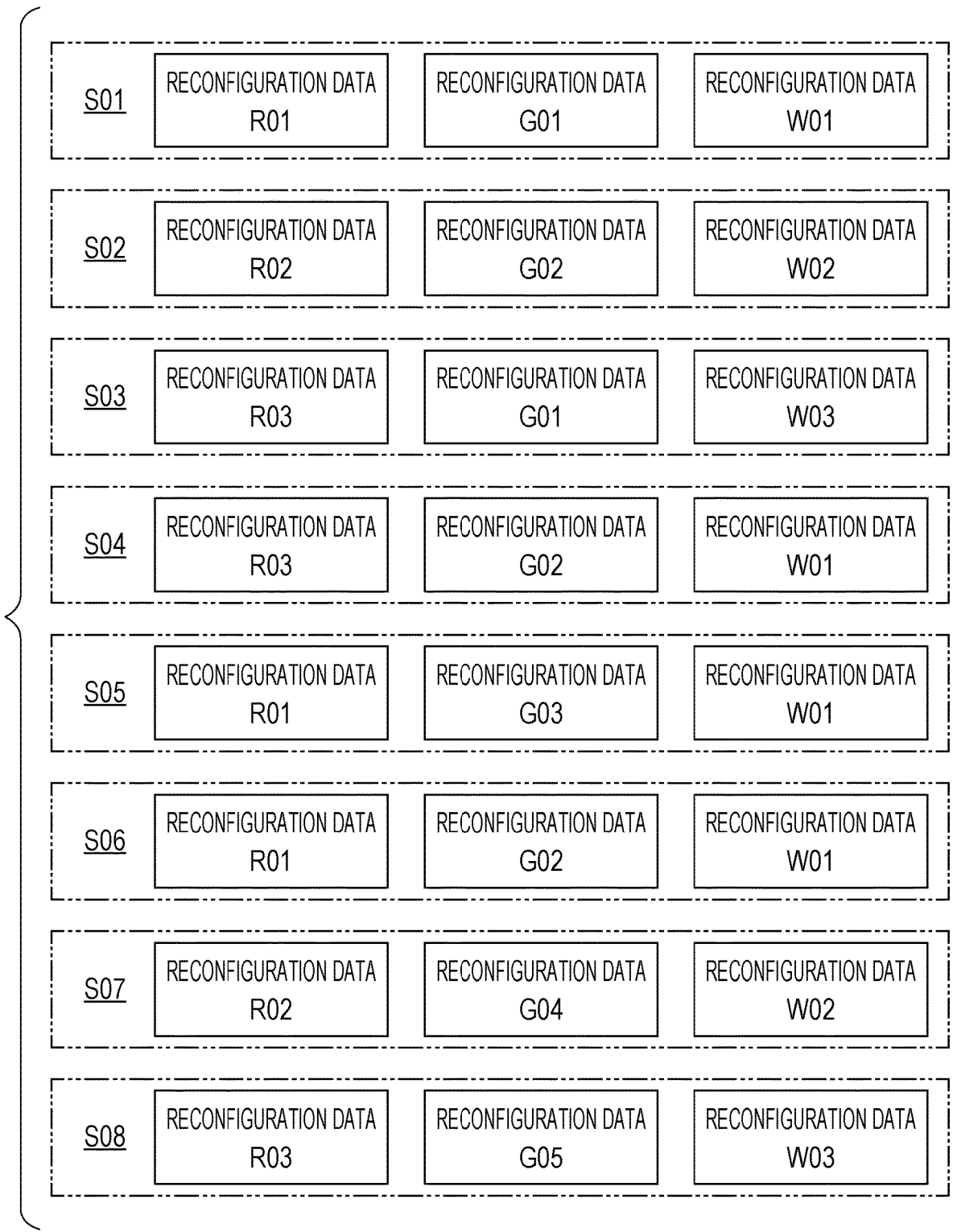
FIG. 5 illustrates an example of reconfiguration data as a comparative example.

FIG. 5 illustrates an example of reconfiguration data as a comparative example. In the example of FIG. 5, for each sequence processing, a combination of reconfiguration data for performing reading processing, image processing, and writing processing that constitute the sequence processing is prepared, and these combinations are stored in a memory corresponding to the internal memory 11 described in the above exemplary embodiment. Accordingly, for example, some reconfiguration data (e.g., reconfiguration data R01) are duplicated in the memory. In contrast, according to the data structure according to the above exemplary embodiment illustrated in FIG. 2, duplicate reconfiguration data are not stored in the memory. Although management data such as the one illustrated in FIG. 3 needs to be stored separately from the reconfiguration data in the above exemplary embodiment, the management data does not include the reconfiguration data themselves and includes only IDs of the reconfiguration data, and therefore a total data size is smaller than that in a case where the reconfiguration data themselves are included, as described above.

Figure 6:
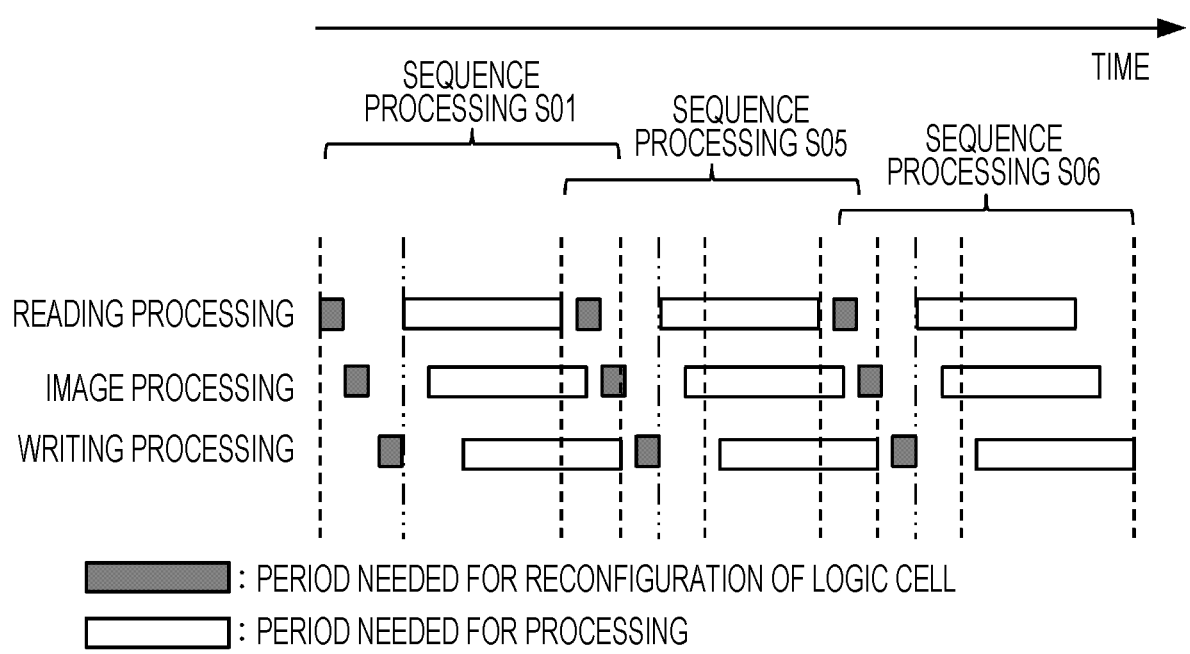
FIG. 6 is a timing diagram illustrating a period needed for operation concerning reconfiguration as a comparative example.
Figure 7:
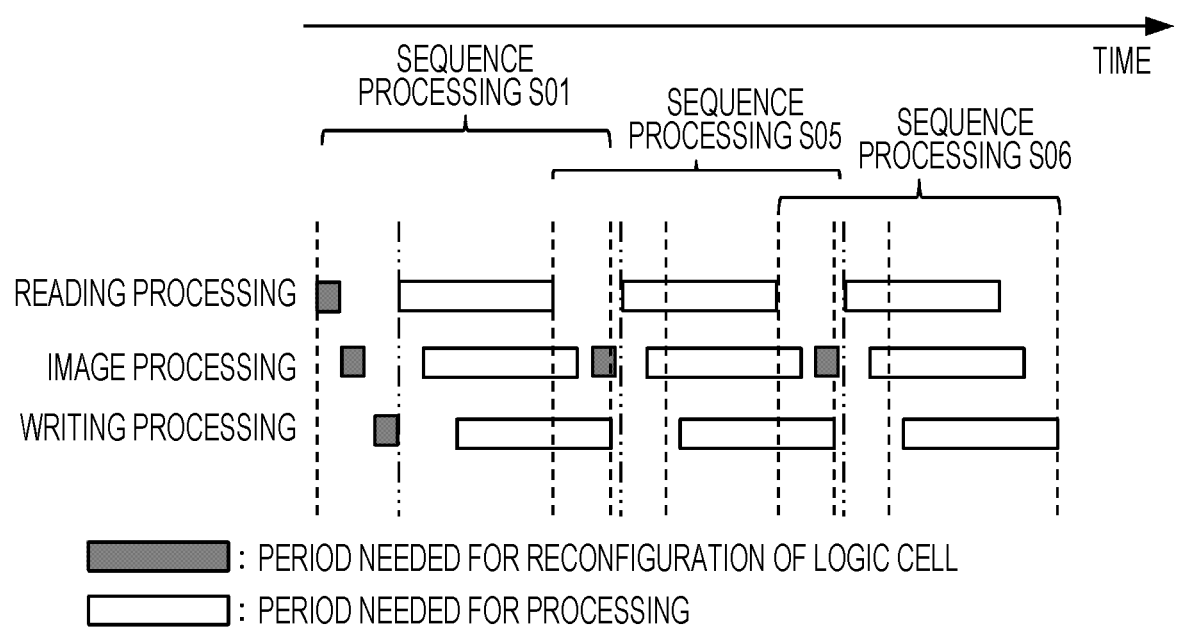
FIG. 7 is a timing diagram illustrating a period needed for operation concerning reconfiguration according to the present exemplary embodiment.

Next, FIG. 6 is a timing diagram illustrating a period needed for operation concerning reconfiguration as a comparative example based on FIG. 5, and FIG. 7 is a timing diagram illustrating a period needed for operation concerning reconfiguration according to the present exemplary embodiment. FIG. 6 illustrates a case where three kinds of sequence processing S01, S05, and S06 are successively performed by three reconfiguration regions, and time proceeds from left to right. When the sequence processing S01 starts, an uppermost reconfiguration region in FIG. 6 performs reconfiguration for performing reading processing that constitutes the sequence processing S01 and starts the reading processing after the reconfiguration. In parallel with this, an intermediate reconfiguration region performs reconfiguration for performing image processing that constitutes the sequence processing S01 and starts the image processing after the reconfiguration. Further in parallel with this, a lowermost reconfiguration region performs reconfiguration for performing writing processing that constitutes the sequence processing S01 and starts the writing processing after the reconfiguration.

After performing the reading processing that constitutes the sequence processing S01, the uppermost reconfiguration region in FIG. 6 performs reconfiguration for performing reading processing that constitutes the sequence processing S05 and starts the reading processing after the reconfiguration. After performing the image processing that constitutes the sequence processing S01, the intermediate reconfiguration region performs reconfiguration for performing image processing that constitutes the sequence processing S05 and starts the image processing after the reconfiguration. After performing the writing processing that constitutes the sequence processing S01, the lowermost reconfiguration region performs reconfiguration for performing writing processing that constitutes the sequence processing S06 and starts the writing processing after the reconfiguration. Similarly, reading processing, image processing, and writing processing that constitute the sequence processing S06 are performed after reconfiguration of the respective reconfiguration regions. In these reconfigurations, whether or not reconfiguration data for performing processing that constitutes sequence processing to be started and reconfiguration data for performing processing that constitutes previous sequence processing are identical is not considered.

Meanwhile, in FIG. 7 illustrating operation according to the present exemplary embodiment, when the sequence processing S01 starts, an uppermost reconfiguration region in FIG. 7 performs reconfiguration for performing reading processing that constitutes the sequence processing S01 and starts the reading processing after the reconfiguration. In parallel with this, an intermediate reconfiguration region performs image processing that constitutes the sequence processing S01 and starts the image processing after the reconfiguration. Further in parallel with this, a lowermost reconfiguration region performs reconfiguration for performing writing processing that constitutes the sequence processing S01 and starts the writing processing after the reconfiguration.

After performing the reading processing that constitutes the sequence processing S01, the uppermost reconfiguration region in FIG. 7 performs reconfiguration for performing reading processing that constitutes the sequence processing S05. However, the uppermost reconfiguration region in FIG. 7 does not perform the reconfiguration since reconfiguration data for the reading processing that constitutes the sequence processing S01 and reconfiguration data for the reading processing that constitutes the sequence processing S05 are identical (see FIG. 3). That is, at this timing, connection between elements is not changed in the uppermost reconfiguration region. Similarly, the uppermost reconfiguration region does not perform reconfiguration since reconfiguration data for the reading processing that constitutes the sequence processing S05 and reconfiguration data for the reading processing that constitutes the sequence processing S06 are identical (see FIG. 3). Furthermore, after performing the writing processing that constitutes the sequence processing S01, the lowermost reconfiguration region performs reconfiguration for performing writing processing that constitutes the sequence processing S05. However, the lowermost reconfiguration region does not perform the reconfiguration since reconfiguration data for the writing processing that constitutes the sequence processing S01 and reconfiguration data for the writing processing that constitutes the sequence processing S05 are identical (see FIG. 3). That is, connection between elements is not changed in the lowermost reconfiguration region in FIG. 7. Similarly, the lowermost reconfiguration region does not perform reconfiguration since reconfiguration data for the writing processing that constitutes the sequence processing S05 and reconfiguration data for writing processing that constitutes the sequence processing S06 are identical (see FIG. 3). As described above, in a case where connection between elements is changed in accordance with designation by reconfiguration data, if designation by at least one reconfiguration data among reconfiguration data for plural kinds of processing that constitutes single sequence processing does not require change of connection between elements in a reconfiguration region, connection between elements is not changed in the reconfiguration region, that is, the same reconfiguration data as that used to connect elements in the reconfiguration region is used. As a result, in FIG. 7, a total period needed to perform the sequence processing S01, S05, and S06 becomes shorter than that in the case of FIG. 6.

Figure 8:
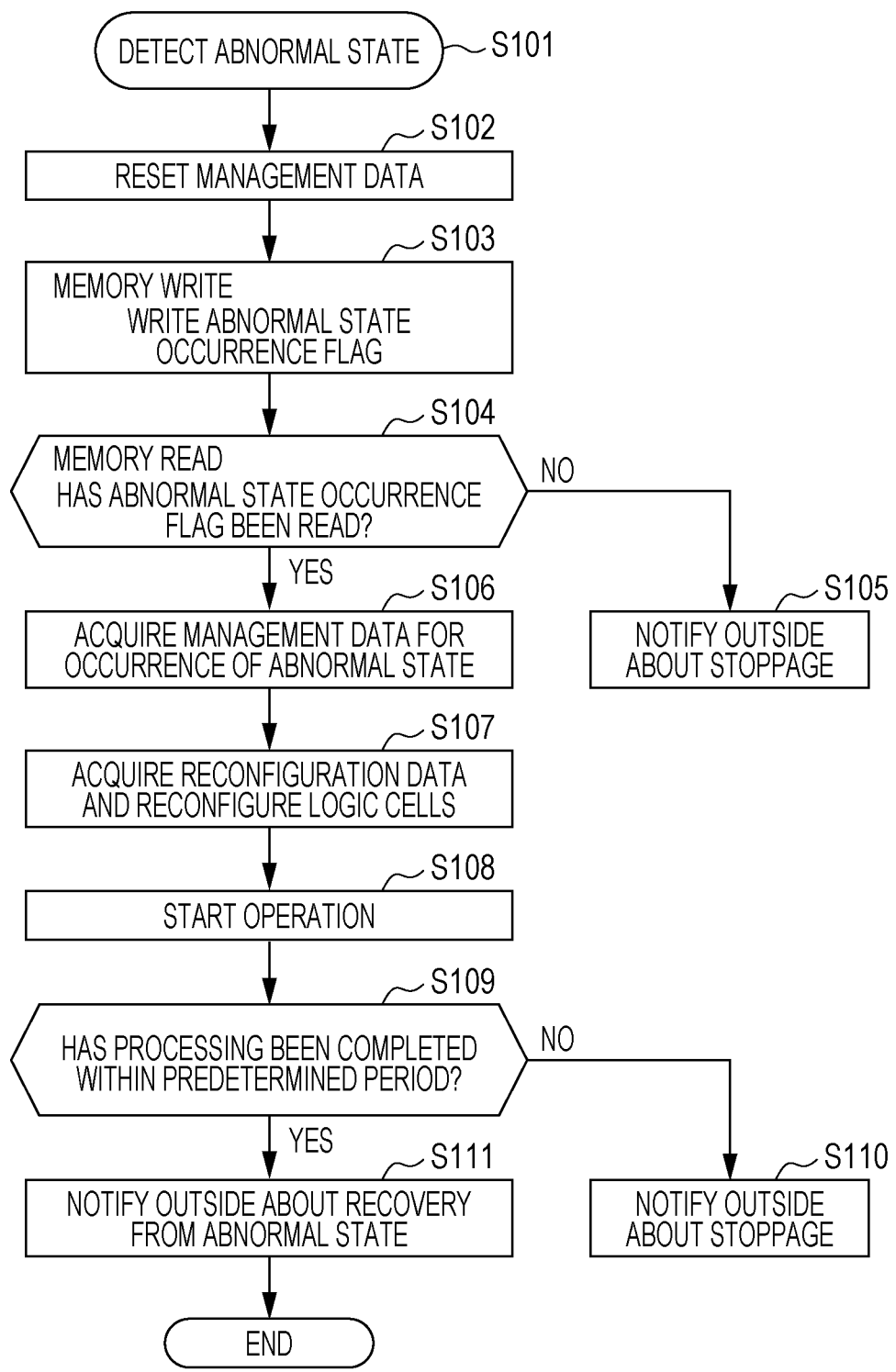
FIG. 8 illustrates an example of operation of the programmable logic circuit device upon occurrence of an abnormality.

Next, an example of operation of the programmable logic circuit device 100 during occurrence of an abnormality is described with reference to FIG. 8. In FIG. 8, when some sort of abnormal state is detected by a predetermined abnormal state detection device or abnormal state detection algorithm (step S101), the processor 10 resets management data used for sequence processing that is being performed at a time of the occurrence of the abnormality (step S102).

Next, the processor 10 writes an abnormal state occurrence flag into the internal memory 11 to check whether or not writing into the internal memory 11 is possible (step S103). Next, the processor 10 checks whether or not the abnormal state occurrence flag can be read from the internal memory 11 to check whether or not reading from the internal memory 11 is possible (step S104). In a case where the abnormal state occurrence flag cannot be read from the internal memory 11 (No in step S104), the processor 10 notifies the outside about stoppage of the processing (step S105).

Meanwhile, in a case where the abnormal state occurrence flag can be read from the internal memory 11 (Yes in step S104), the processor 10 reads out management data for sequence processing for an abnormal state corresponding to the sequence ID "08" from the internal memory 11 (step S106).

Next, the processor 10 acquires reconfiguration data for an abnormal state corresponding to reconfiguration data IDs (the reconfiguration data IDs "R03", "G05", and "W03" in this example) designated by the acquired management data from the external memory 200 by using these reconfiguration data IDs as a key. Then, the processor 10 performs reconfiguration in the logic cells 13 of the reconfiguration regions 12 in accordance with designation by the acquired reconfiguration data (step S107). Specifically, the processor 10 writes reconfiguration data into a look-up table of any reconfiguration region. This changes connection between elements in a logic cell in the reconfiguration region with reference to the look-up table. Each reconfigured logic cell 13 starts operation for an abnormal state (step S108). As a result, the sequence processing that is being performed is not performed, and discard of data and writing of predetermined data described above are performed.

Next, the processor 10 determines whether or not the sequence processing for an abnormal state has been completed within a predetermined period (step S109). In a case where the sequence processing for an abnormal state is not completed within the predetermined period (No in step S109), the processor 10 notifies the outside about stoppage of the processing (step S110). In a case where the sequence processing for an abnormal state has been completed within the predetermined period (Yes in step S109), the processor 10 notifies the outside about recovery from the abnormal state (step S111).

According to the above exemplary embodiment, in a case where an abnormality occurs, the abnormality can be addressed without initializing whole reconfiguration regions.

Although the exemplary embodiment of the present disclosure has been described in detail above, the present disclosure is not limited to the specific exemplary embodiment and can be modified or changed in various ways within the scope of the present disclosure recited in the claims.

The reconfiguration data can be any reconfiguration data that designate connection between elements in the reconfiguration regions 12 so that sequence processing that is being performed at a time of occurrence of an abnormality is not performed and may be, for example, reconfiguration data for checking operation in the reconfiguration regions 12. Specifically, the reconfiguration data are reconfiguration data for reading predetermined data from the outside in the sequence processing that is being performed at the time of occurrence of the abnormality, reconfiguration data for performing predetermined processing on the read data, and reconfiguration data for writing the data that has been subjected to the predetermined processing into the internal memory 11. Completion of the processing within a predetermined period in the reconfiguration regions 12 reconfigured in accordance with designation by the reconfiguration data means that operation in the reconfiguration regions 12 has been checked.

The reconfiguration data may be reconfiguration data that vary depending on a cause of the abnormality. The reconfiguration data may be, for example, only reconfiguration data for performing at least one of reading of data, processing on the read data, and writing of the data that has been subjected to the processing depending on a cause of the abnormality such as malfunction of a fan of an image processing apparatus, an abnormality concerning heat, no response from a CPU, or processing time-out or may be reconfiguration data for performing operation check that varies depending on a cause of the abnormality.

Although the sequence processing is, for example, image processing on image data in the above exemplary embodiment, the sequence processing may be processing other than image processing.

Although the management data is stored in the internal memory 11, the management data may be stored in the external memory 200. Although the reconfiguration data is stored in the external memory 200, the reconfiguration data may be stored in the internal memory 11.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A programmable logic circuit device comprising:
   a processor; and
   a plurality of reconfiguration regions each including a circuit configured by change of connection between elements,
   wherein
   the processor is configured to:
      upon detection of an abnormality while performing processing in a state in which the elements in the reconfiguration regions are connected in accordance with reconfiguration data designating connection between the elements in the reconfiguration regions, wherein the abnormality comprises a cell of a reconfiguration region of the plurality of reconfiguration regions, acquire reconfiguration data designating such connection between the elements that the processing being performed is not performed; and
      change connection between the elements of the cell of the reconfiguration region in the reconfiguration regions in accordance with the designation by the acquired reconfiguration data.

2. The programmable logic circuit device according to claim 1, wherein
   the reconfiguration data designating connection between the elements in the reconfiguration regions in accordance with the abnormality is reconfiguration data for discarding read data.

3. The programmable logic circuit device according to claim 2, wherein
   the reconfiguration data designating connection between the elements in the reconfiguration regions in accordance with the abnormality is reconfiguration data that varies depending on a cause of the abnormality.

4. The programmable logic circuit device according to claim 1, wherein
   the reconfiguration data designating connection between the elements in the reconfiguration regions in accordance with the abnormality is reconfiguration data for discarding data obtained by performing processing on read data.

5. The programmable logic circuit device according to claim 4, wherein
   the reconfiguration data designating connection between the elements in the reconfiguration regions in accordance with the abnormality is reconfiguration data that varies depending on a cause of the abnormality.

6. The programmable logic circuit device according to claim 1, wherein
   the reconfiguration data designating connection between the elements in the reconfiguration regions in accordance with the abnormality is reconfiguration data for writing predetermined data into a memory into which data obtained by performing processing on read data is written.

7. The programmable logic circuit device according to claim 6, wherein
   the reconfiguration data designating connection between the elements in the reconfiguration regions in accordance with the abnormality is reconfiguration data that varies depending on a cause of the abnormality.

8. The programmable logic circuit device according to claim 1, wherein
   the reconfiguration data designating connection between the elements in the reconfiguration regions in accordance with the abnormality is reconfiguration data for checking operation in the reconfiguration regions.

9. The programmable logic circuit device according to claim 8, wherein the reconfiguration data designating connection between the elements in the reconfiguration regions in accordance with the abnormality is reconfiguration data that varies depending on a cause of the abnormality.

10. The programmable logic circuit device according to claim 1, wherein the reconfiguration data designating connection between the elements in the reconfiguration regions in accordance with the abnormality is reconfiguration data that varies depending on a cause of the abnormality.

11. An image processing apparatus comprising the programmable logic circuit device according to claim 1.

12. A programmable logic circuit device comprising:

a plurality of reconfiguration regions each including a circuit configured by change of connection between elements;

means for acquiring, upon detection of an abnormality while performing processing in a state in which the elements in the reconfiguration regions are connected in accordance with reconfiguration data designating connection between the elements in the reconfiguration regions, wherein the abnormality comprises a cell of a reconfiguration region of the plurality of reconfiguration regions, reconfiguration data designating such connection between the elements that the processing being performed is not performed; and means for changing connection between the elements of the cell of the reconfiguration region in the reconfiguration regions in accordance with the designation by the acquired reconfiguration data.

* * * * *